United States Patent
Roth

(10) Patent No.: US 7,132,895 B2
(45) Date of Patent: Nov. 7, 2006

(54) DIGITALLY-CONTROLLED OSCILLATOR

(75) Inventor: Eric Roth, Jona (CH)

(73) Assignee: Bridgeco AG, Dubendorf (CH)

( * ) Notice: Subject to any disclaimer, the term of this patent is extended or adjusted under 35 U.S.C. 154(b) by 0 days.

(21) Appl. No.: 10/518,874

(22) PCT Filed: Jun. 23, 2003

(86) PCT No.: PCT/CH03/00405

§ 371 (c)(1),
(2), (4) Date: Jul. 21, 2005

(87) PCT Pub. No.: WO2004/004125

PCT Pub. Date: Jan. 8, 2004

(65) Prior Publication Data

US 2006/0055471 A1    Mar. 16, 2006

(30) Foreign Application Priority Data

Jun. 27, 2002    (CH) .................................. 1111/02

(51) Int. Cl.
*H03L 7/00*    (2006.01)
(52) U.S. Cl. .................... 331/1 A; 331/34; 331/177 R; 331/57; 327/156; 327/158; 327/159

(58) Field of Classification Search ................ 331/1 A, 331/16, 57, 34, 177 R; 327/156, 159, 160, 327/158
See application file for complete search history.

(56) References Cited

U.S. PATENT DOCUMENTS

| 5,602,884 A | 2/1997 | Wieczorkiewicz et al. .. 375/376 |
| 6,114,915 A | 9/2000 | Huang et al. .................. 331/25 |
| 6,222,407 B1 | 4/2001 | Gregor ........................ 327/269 |
| 6,259,330 B1 | 7/2001 | Arai ............................. 331/57 |
| 6,480,047 B1 * | 11/2002 | Abdel-Maguid et al. .... 327/161 |
| 2002/0008557 A1 | 1/2002 | Abdel-Maguid et al. .... 327/161 |

* cited by examiner

*Primary Examiner*—Arnold Kinkead
(74) *Attorney, Agent, or Firm*—Welsh & Katz, Ltd.

(57) ABSTRACT

A digitally-controlled oscillator comprises an input for the supply of a digital input word, an adder, a stable local oscillator and a delay circuit, comprising a delay stage with a number of serially-connected coarse delay elements and a fine delay stage with a number of serially-connected fine delay elements. The coarse delay stage and the fine delay stage are embodied such that the maximum total delay and the minimum total delay differ by at most one period of the cycle signal. The delay produced by the number of fine delay elements corresponds to the delay of one coarse delay element. Each coarse delay element and each fine delay element comprise their own controllable selector.

5 Claims, 8 Drawing Sheets

DIGITALLY-CONTROLLED OSCILLATOR

FIELD OF INVENTION

The invention relates to a digitally controlled oscillator in accordance with the precharacterizing part of the independent patent claim.

BACKGROUND

Sending audio and video data in real time requires the data rate at the transmitter and receiver to match in order to avoid impairing the reproduction quality as a result of underflows or overflows in buffer-stores for data (buffers). The receiver accordingly also needs to receive clock information which defines the exact data rate at all times. This clock information may come from the transmitter itself or else from an external clock reference, and in the latter case the transmitter also needs to be synchronized to this external clock reference.

In both cases, clock information needs to be distributed, however. In this context, the transmission is frequently not ideal, i.e. the clock is overlaid with jitter during distribution. For this reason, clock recovery is frequently used, the task of which is to suppress or reduce this jitter by means of filtering (and possibly also to multiply the clock frequency).

Clock recovery with jitter suppression is normally implemented by a phase trimming circuit PLL (phase-locked loop). The clock generator used for the PLL is frequently voltage controlled oscillators VCO. However, such VCOs have, as analog circuits, the drawback that they can be integrated on an application-specific integrated circuit ASIC only in complex fashion.

Digitally controlled oscillators DCO are far superior to an analog VCO not only in respect of their integratability in an ASIC but also in respect of their power and area requirements. Most DCOs are based on a DLL (Delay-Locked Loop) or on a ring oscillator. Although ring oscillators may be used for jitter suppression (jitter filtering), the low frequency resolution and the high susceptibility to natural jitter limit the range of application of ring oscillators. Although conventional DLL-based implementations of DCOs can multiply the frequency of the input signal, they provide no jitter filtering, since there is no genuine frequency synthesis involved.

A PLL with a DLL-based solution for a DCO has already been described in U.S. Pat. No. 2002/0008557. The DCO is clocked by a stable oscillator. In addition, the DCO comprises an adder which generates a desired output frequency. An input word is repeatedly added to a start value for the adder, so that the adder fills or overflows cyclically. Once the adder has filled or overflowed, a rising edge of the output signal is generated upon the next rising edge of the input clock (clock from the stable oscillator). If generation of the rising edge of the output signal produces a "remnant term" on the adder (that is to say if the input word added to the counter reading of the adder was larger than the remaining capacity of the adder), this remnant term (which is that part of the input word which exceeds the capacity of the adder) is written to a register and represents the timing error in the output signal. The remnant term is used to actuate a multistage delay circuit (coarse delay, fine delay). The delay circuit has a plurality of delay stages (coarse delay stage, fine delay stage), each delay stage being provided with individual discrete taps downstream of each delay element. In this case the remnant term controls which of the taps in the delay stage is respectively tapped off so that the output signal (which, of course, has a timing error which is represented by the remnant term) can be delayed such that the timing error in the output signal is compensated for when the correspondingly delayed output signal then has the correct phase again.

To select the respectively suitable tap, the delay stage contains a multiplexer (selector) whose inputs are connected to the individual taps downstream of the respective delay elements (specifically a respective input on the multiplexer is connected to a tap downstream of a delay element), so that the remnant term can actuate the multiplexer such that the corresponding tap is selected for which the output signal is delayed such that the timing error is compensated for.

This is done by virtue of a coarse delay stage taking the coarse delay elements it contains as a basis for first of all coarsely delaying the output signal. The coarse delay stage delays the output signal as closely as possible to the delay which is required in order to compensate for the timing error, as is possible on the basis of the delay by the individual coarse delay elements (at most just as far as the required delay; if this is not exactly possible on the basis of the delay by the individual coarse delay elements, then as far as that coarse delay which is just below the delay which is required for the compensation). The signal delayed by the coarse delay stage is then delayed further in at least one fine delay stage (or else in a plurality of fine delay stages) until the delay which is necessary in order to compensate for the timing error is reached (or as close to this as is actually possible on the basis of the delay by the individual fine delay elements). The fine delay stage is designed such that passing through all of the fine delay elements (maximum delay by the fine delay stage) brings about a delay which corresponds to exactly one coarse delay element.

The difference between the maximum and minimum delays by the entire delay circuit (coarse delay stage and fine delay stages) is exactly one period of the input clock (clock from the stable oscillator).

As already mentioned, the inputs of the multiplexer need to be connected to the many individual taps on a delay stage of this type, which causes significant difficulties for the implementation of such a delay stage in an integrated circuit (e.g. on silicon), because each tap downstream of a delay element needs to be connected to the input of the multiplexer by a connection of equal length (or in better terms: of equal shortness) so that no relevant propagation time differences arise on the path from the taps downstream of the individual delay elements to the inputs of the multiplexer (otherwise the accuracy of the delay would be impaired no less than considerably, if the operability were not actually seriously called into question).

In the case of the coarse delay stage described in U.S. Pat. No. 2002/0008557, these alone are 64 taps which need to be connected to the inputs of the multiplexer. However, beyond the 64 taps which are used, the individual delay stages normally also contain a significantly larger number of delay elements which are not always all used, however, but whose taps still need to be connected to the inputs of the multiplexer, because, depending on the application, it is, of course, not known beforehand how many delay elements are actually needed for a particular application. Hence, taking into account the stipulation that no relevant propagation time differences must arise, the difficulties in implementing a delay stage of this type in silicon become immediately clear upon consideration of the propagation time for the signals between respective taps and the associated inputs of the multiplexer.

SUMMARY

It is therefore an object of the invention to propose a digitally controlled oscillator of the type mentioned above but in which the implementation of the delay circuit in an integrated circuit (e.g. on silicon) is much simpler.

This object is achieved by the inventive digitally controlled oscillator as characterized by the features of independent patent claim 1. Advantageous exemplary embodiments of a digitally controlled oscillator of this type can be found in the features of the dependent patent claims.

In particular, each coarse delay element and each fine delay element comprises a dedicated actuatable selector. This has the advantage that a large number of signals distributed over individual taps do not all have to be routed to a selector which then selects the respective tap—corresponding to the required delay. This allows simpler implementation in an integrated circuit, because a multiplicity of taps, namely downstream of every single delay element, is not required and is also not present.

In one advantageous exemplary embodiment of the inventive digitally controlled oscillator, the coarse delay element comprises a delay element and the selector, with one input on the selector in the respective coarse delay element being connected to the output of the delay element of the same coarse delay element and a further input on the selector being connected to the output of the selector in the coarse delay element connected immediately downstream. That is to say that each selector requires, in principle, only two signal supplies, namely the output signal from its own delay element and the output signal from the selector in the delay element connected immediately downstream. This means that implementation in silicon is a particularly simple matter, and that separate taps do not exist downstream of the individual delay elements and are also not needed.

In a further exemplary embodiment of the inventive digitally controlled oscillator, the fine delay element has a common input and at least two drivers connected to the common input. A capacitive load is provided at the output of one of the two drivers (in the case of exactly two drivers). One input on the selector is connected to the output of the driver without the capacitive load and a further input on the selector is connected to the output of the driver with the capacitive load. The output of the selector in the respective fine delay element is connected to the common input of the fine delay element connected immediately downstream. Charging the capacitive load causes the signal not to be applied until at a later time, because the capacitive load needs to be charged first. Since both the output signal from the driver without a capacitive load and the output signal from the driver with a capacitive load are applied to the inputs of the selector, the selector can easily select whether or not the delay brought about by the capacitive load is activated in the case of the respective delay element. Another advantage of this is that only drivers of the same type can be used to achieve a fine delay which is shorter than the fine delay in an individual driver, because the propagation times of the signal through the two paths differ by less than the propagation time through a single driver.

In a further advantageous exemplary embodiment of the inventive digitally controlled oscillator, the fine delay element comprises a plurality of drivers whose inputs are connected to one another to form a common input and whose outputs are connected to one another to form a common output. In this case, the selector is designed such that the individual drivers may be activated or deactivated. The common output is connected to the common input of the fine delay element connected immediately downstream. In this case, the selector is in a form such that the individual drivers may be activated ("enabling") or not. The individual drivers each have an input capacitance, regardless of whether or not the respective driver has been activated. Hence, the more drivers there are activated in a preceding fine delay element, the less time is required before the input capacitances of the subsequent fine delay element are charged, and the faster the output signal is then applied to the common output. In this way, it is thus a very simple matter to set the delay time of the individual delay elements.

In addition, the invention also relates to a digital phase trimming circuit, having an input clock signal, a phase comparator, a filter and a digitally controlled oscillator, and having a feedback path which feeds back an output signal generated by the digitally controlled oscillator to the phase comparator, possibly with frequency division. In this case, the digitally controlled oscillator is designed as described above.

BRIEF DESCRIPTION OF THE DRAWINGS

Further advantageous refinements of the inventive digitally controlled oscillator can be found in the description below of exemplary embodiments with reference to the drawing, in which.

DETAILED DESCRIPTION

Figure 1:
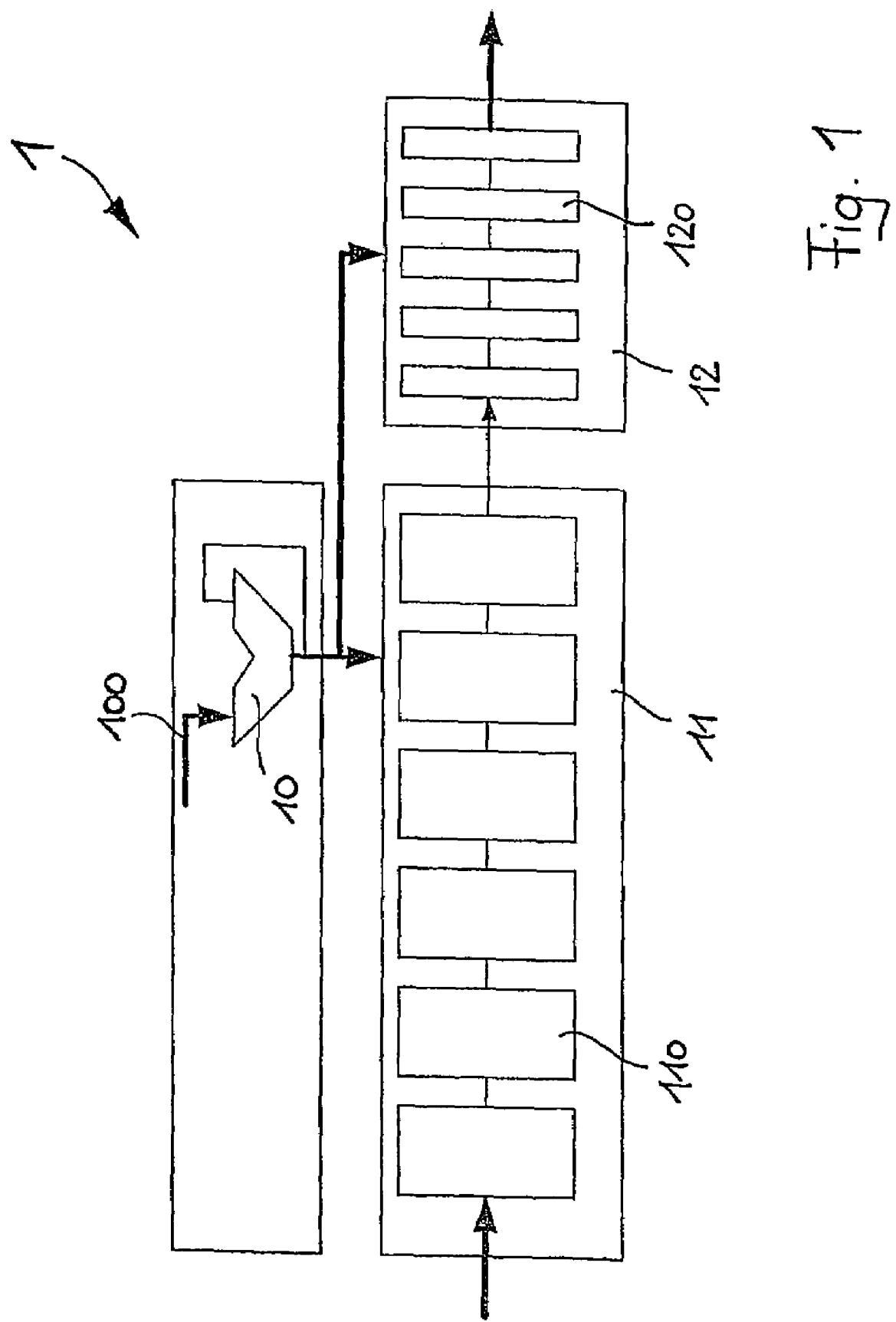
FIG. 1 shows a block diagram of an exemplary embodiment of a few fundamental elements of an inventive digitally controlled oscillator (DCO)

The block diagram in FIG. 1 shows a few fundamental elements of an exemplary embodiment of an inventive digitally controlled oscillator 1. The latter comprises an adder 10 for summing digital input words 100 which are supplied to the adder 10. These digital input words are representative of the respective frequency generated at the output of the digitally controlled oscillator 1. The digital input words 100 are summed in the adder 10, which actuates the delay stages, in the exemplary embodiment shown here a coarse delay stage 11 and a fine delay stage 12, in a manner which will be explained in more detail. The coarse delay stage 11 comprises a plurality of coarse delay elements 110, and the fine delay stage 12 comprises a plurality of fine delay elements 120, only a very limited number of coarse delay elements 110 and fine delay elements 120 being shown in each case in FIG. 1 for reasons of better clarity.

Figure 2:
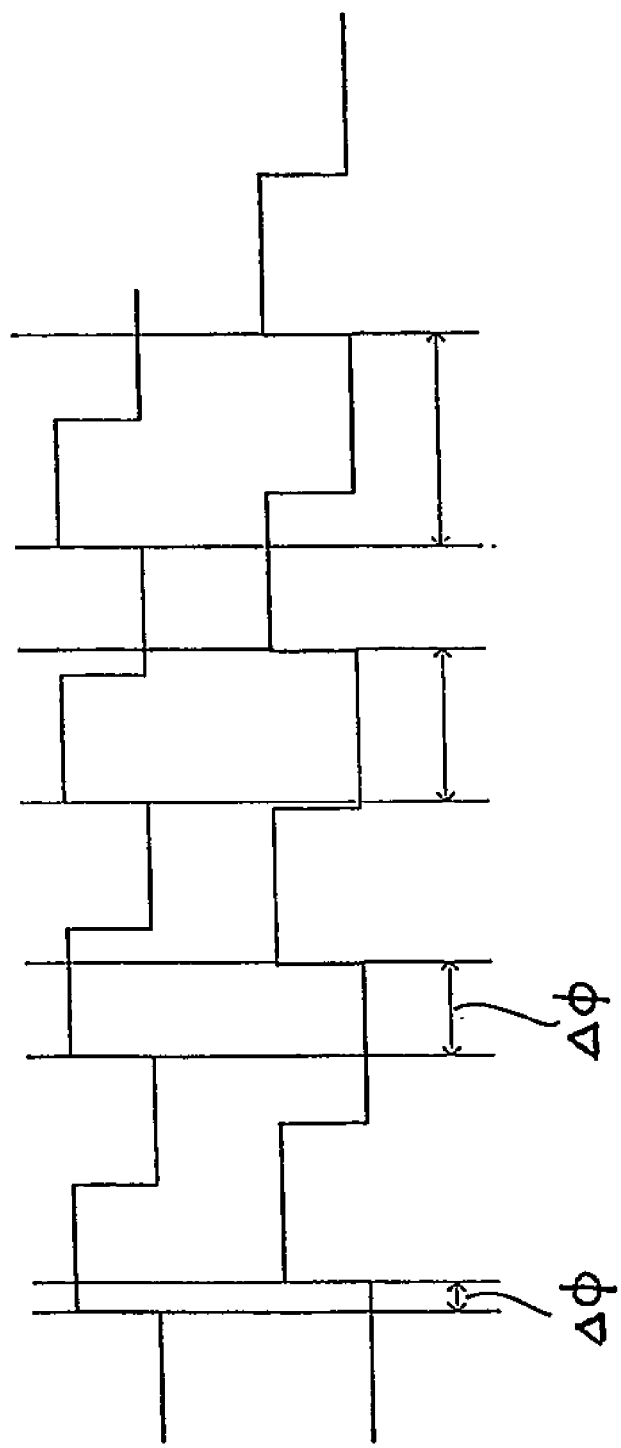
FIG. 2 shows an illustration of a stable input clock of the DCO and of an input clock generated by the DCO.

FIG. 2 shows the input clock from a stable local oscillator at the constant frequency $f_0$, the stable local oscillator not being shown in FIG. 1; such stable local oscillators (e.g. highly stable crystal oscillators) are sufficiently well known. The output frequency f of the output clock generated by the digitally controlled oscillator differs from the frequency $f_0$ of the input clock generated by the stable local oscillator. In this case, the digitally controlled oscillator thus takes the input words as a basis for generating a frequency f which differs from the frequency $f_0$ of the input clock.

This can easily be seen in FIG. 2 from the fact that the phase difference $\Delta\phi$ between the respective rising edge of the input clock at the frequency $f_0$ and the rising edge of the output clock at the frequency f (which is likewise constant in this case) always increases by a constant amount. A constant increase in the phase difference $\Delta\phi$ means nothing other than a constant frequency difference, however.

In principle, of course, what is involved is the use of the digitally controlled oscillator to replace a clock which may be subject to jitter with a low-jitter clock (of the same frequency and phase) which is generated using the (jitter-free) input clock from the stable local oscillator (or by a clock at a multiple or a fraction of this clock frequency), with the delay stages being used too. The way in which this simulation of the input clock using a (jitter-free) input clock from the stable local oscillator takes place on the basis of the fundamental principle is already revealed by U.S. Pat. No. 2002/0008557, which was mentioned at the outset.

To this end, however, it is necessary to know how many coarse delay elements 110 and how many fine delay elements 120 are required and how many fine delay elements 120 are needed in order to effect the maximum admissible delay when all of the coarse delay elements 110 are activated (the difference between the maximum and minimum delays must be no more than one period duration of the stable input clock).

Figure 3:
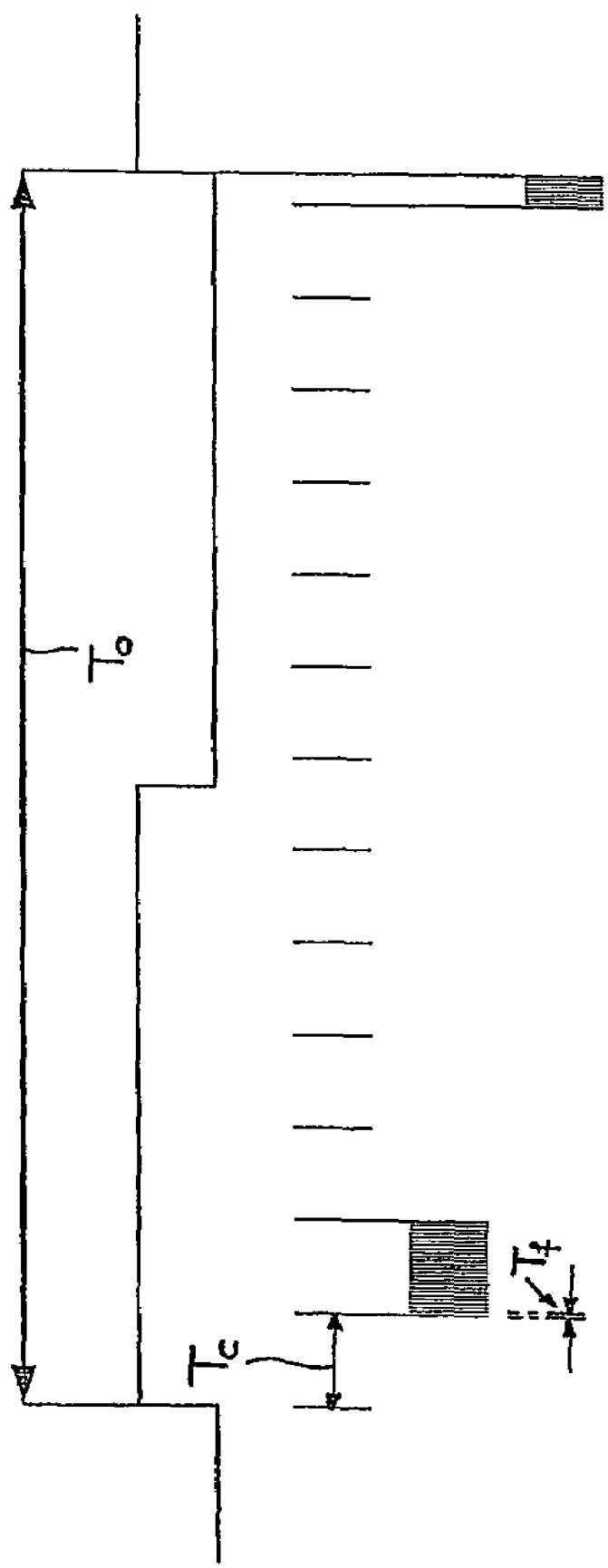
FIG. 3 shows a period of the stable input clock with possible division of this period into time slots which correspond to the delays by the coarse delay elements and to the delays by the fine delay elements.

FIG. 3 shows one period of the input clock at the frequency $f_0$ and of the corresponding period duration $T_0$ (where: $T_0=1/f_0$), with possible division of the period duration $T_0$ into time slots $T_c$ and $T_f$ which correspond to the delays by the coarse delay elements 110 (FIG. 1) and the delays of the fine delay elements 120 (FIG. 1).

FIG. 3 shows that the required number of coarse delay elements 110 is determined such that the sum of the delays $T_c$ which is effected by this number of coarse delay elements 110 is just smaller than one period duration $T_0$ of the input clock. The required number of fine delay elements 120, on the other hand, is determined such that the sum of the delays $T_f$ which is effected by this number of fine delay elements 120 is just equivalent to the delay $T_c$ by a coarse delay element 110. In addition, it is also necessary to determine the required number of fine delay elements 120 which is necessary in order to achieve a total delay which is exactly equivalent to one period duration $T_0$ of the input clock (or is just shorter), that is to say the difference between the period duration $T_0$ of the input clock and the delay which is effected by the previously determined number of coarse delay elements. This difference likewise corresponds to a number of fine delay elements which is smaller than the total required number of fine delay elements, however. Nevertheless, it is also necessary to determine this number of fine delay elements, since the difference between the maximum and minimum total delay which are effected by the two delay stages together needs to be shorter than one period duration $T_0$ of the input clock.

Figure 4:
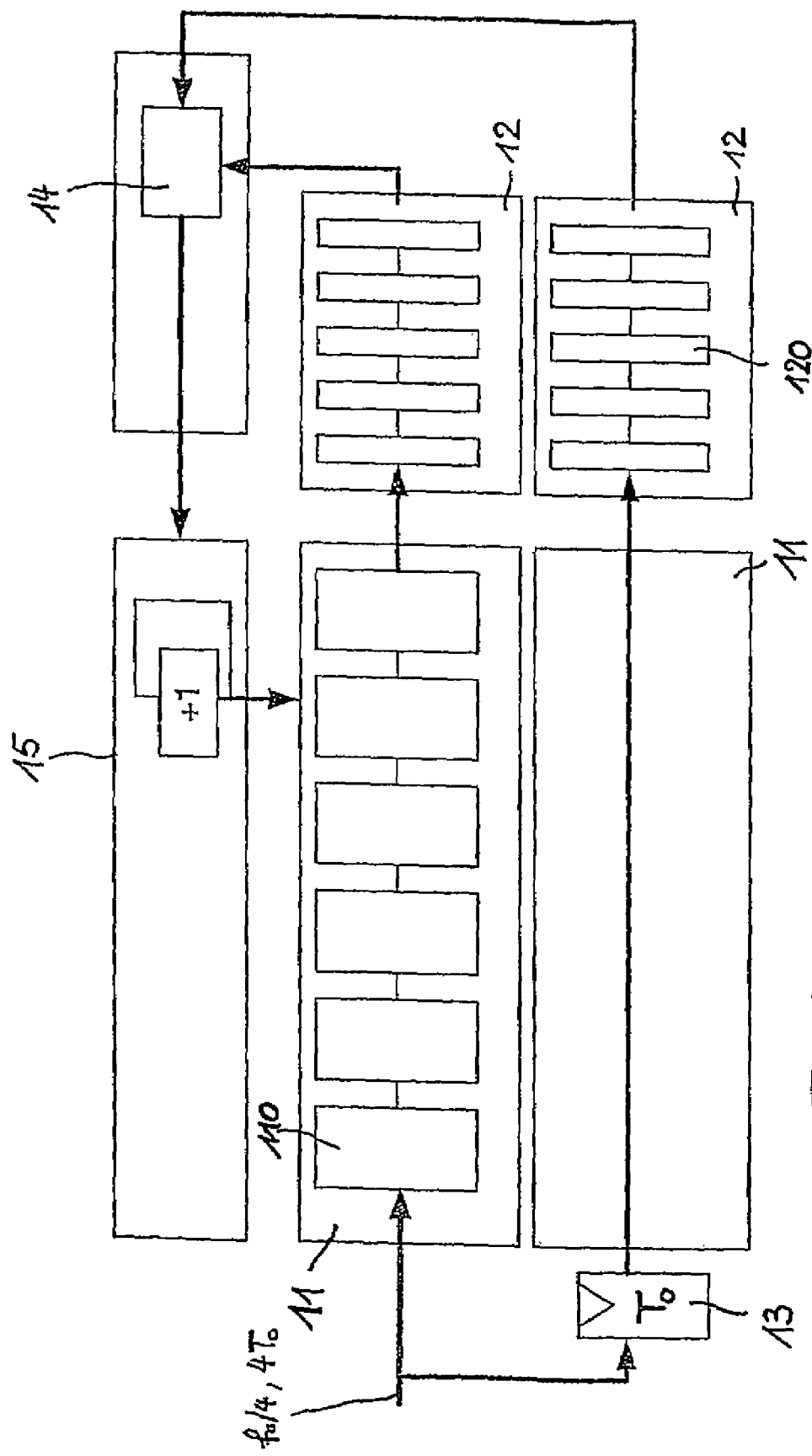
FIG. 4 shows a block diagram to explain the calibration operation when calibrating the coarse delay stage.

FIG. 4 shows a block diagram of how the calibration operation takes place when calibrating the coarse delay stage 11, that is to say how the number of coarse delay elements 110 is determined which together effect a coarse delay which is just below a period duration $T_0$ of the input clock from the stable local oscillator at the frequency $f_0$. To this end, two paths have a stable input clock at the frequency $f_0/4$ (period duration $4T_0$) applied to them as a signal. This clock signal at the frequency $f_0/4$ may be obtained, by way of example, through "clock gating" from the clock signal at the frequency $f_0$ in the stable local oscillator (frequency division). This lower frequency may become necessary because the "offset delays" in the delay stages 11, 12 may be too great for the clock signal at the frequency $f_0$ of the stable local oscillator to be able to be used directly, which may be due to the choice of a particular semiconductor for the integrated circuit, for example. When very fast semiconductors (or a lower frequency for the stable local oscillator) are chosen, the frequency $f_0$ of the stable local oscillator may also be used directly.

The first path contains a coarse delay stage 11 which is to be calibrated, which comprises a number of coarse delay elements 110. This coarse delay stage 11 is followed by a fine delay stage 12 which is passed through in idle mode (no fine delay element activated) and which is basically passed through by the signal only because it may have an "offset" delay without even just a single fine delay element 120 having been activated.

In the second path, the signal first passes through a delay element 13 which delays the signal by precisely the duration $T_0$, and hence the signal in the second path is then delayed by one quarter period with respect to the signal in the first path. The signal then passes through a coarse delay stage 11 which is operated in idle mode. The subsequent fine delay stage 12 in the second path is also operated in idle mode (no fine delay element activated).

The output signals from the fine delay stages 12 in the two paths is now supplied to a phase comparator 14 which compares the phases of the two signals to one another. Since the signal which has passed through the second path is behind the signal which has passed through the first path by one quarter of the period duration (namely by $T_0$, note: period duration of the signal is $4T_0$ in this case), without taking into account the coarse delay stage 11 in the first path, the number of coarse delay elements 110 in the coarse delay stage 11 which is to be calibrated in the first path now needs to be ascertained such that the signal, upon passing through the number of coarse delay elements 110 ascertained in this manner, is almost in phase with the signal which has passed through the second path.

To this end, a coarse delay element 110 in the first path is first activated and the phase comparator 14 respectively compares the phases of the output signals from the fine delay stages 12 in the two paths. If the phase difference corresponds to a delay which is greater than the delay by a coarse delay element 110, then a controller 15 activates a further coarse delay element 11C. Next, the signal (stable input clock) passes through the two paths again and the phase comparator 14 performs a fresh comparison between the phases. This is repeated until the phase difference on the phase comparator 14 is just short of corresponding to a delay through a coarse delay element 110. The required number of coarse delay elements 110 has thus been ascertained.

Figure 5:
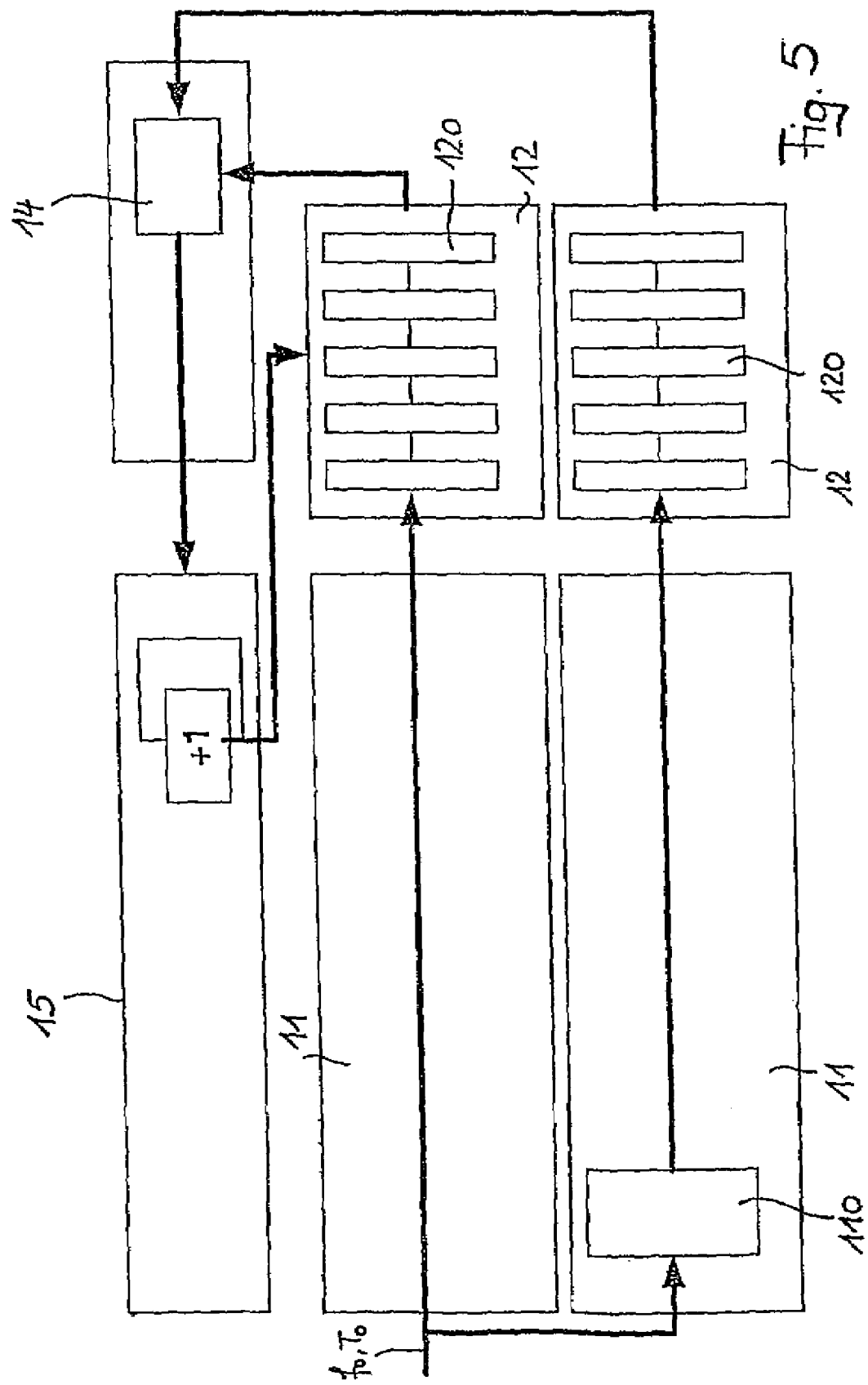
FIG. 5 shows a block diagram to explain the calibration operation when calibrating the fine delay stage.

The way in which the fine delay stage 12 is calibrated can be seen from FIG. 5. It is thus necessary to ascertain the number of fine delay elements 120 in a fine delay stage 12 which together effect a delay corresponding to the delay by a single coarse delay element 110 in the coarse delay stage 11. To this end, two paths have a stable input clock, e.g. the clock from the stable local oscillator (frequency $f_0$, period duration $T_0$), applied to them as a signal.

In the second path, the signal passes through a coarse delay stage 11 having a single activated delay element 110 and then passes through a fine delay stage 12 in idle mode (no fine delay element 120 activated).

In the first path, the signal passes through a coarse delay stage 11 in idle mode (no coarse delay element 110 activated) and then passes through a fine delay stage 12 which is to be calibrated. The output signals from the fine delay stages 12 in the two paths are supplied to the phase comparator 14, which compares the phases of the two signals with one another.

Initially disregarding the delay effected by the fine delay elements 120 in the first path, the output signal from the second path is thus delayed compared to the signal in the first path by the coarse delay effected by the single activated coarse delay element 110. This delay corresponds to a phase difference which is applied to the phase comparator 14. Next, the signal (stable input clock) passes through the two paths again and the phase comparator compares the phases again. This is repeated until the phase difference on the phase comparator 14 is just short of corresponding to a delay by a coarse delay element 110. The required number of coarse delay elements 110 has thus been ascertained.

If this phase difference corresponds to a delay which is still greater than the delay by a fine delay element 120, the controller 15 activates a further fine delay element 120 in the fine delay stage 12 in the first path. Next, the signal (stable input clock) passes through the two paths again and the phase comparator compares the phases again. This is repeated until the phase difference on the phase comparator 14 is zero (or until the phase difference corresponds to a delay which is shorter than the delay by a fine delay element 120).

The number of required fine delay elements 120 which correspond to a coarse delay element 110 has thus been ascertained.

Finally, it is also necessary to ascertain how many fine delay elements 120 are required in addition to the ascertained number of coarse delay elements 110 in order to bring about a delay which corresponds precisely to the period duration $T_0$ of the input clock. This is basically done in the same manner as when ascertaining the required number of coarse delay elements 110 (that is to say frequency $f_0/4$, period duration $4T_0$), but with the number of coarse delay elements 110 having been prescribed (since it is that number of coarse delay elements which effect a delay which is shorter than the period duration $T_0$ of the clock from the stable local oscillator by less than the delay of a single coarse delay element). Then, only the number of fine delay elements 120 is determined which, together with the coarse delay elements 110, effects a delay which corresponds to precisely one period duration (or which effects a delay which is shorter than the period duration of the input clock by less than the delay of a single fine delay element).

These three bits of information (number of coarse delay elements required maximum, number of fine delay elements required maximum, number of fine delay elements required to achieve the maximum delay time) concludes the calibration.

The respective total delay (delay by the coarse delay stage 11 and by the fine delay stage 12) is now always proportional to the accumulated counter reading for the adder 10. If a counter reading is reached which corresponds to the maximum possible delay, "gating" takes place (the next rising edge of the input clock is ignored), the counter is reset again and that portion of the last input word which exceeds the maximum counter reading is used to actuate the coarse delay stage 11 and the fine delay stage 12. Next, the digital input words are added again, and the accumulated counter reading corresponds to the respective total delay again, until the counter overflows again, and so on.

Figure 6:
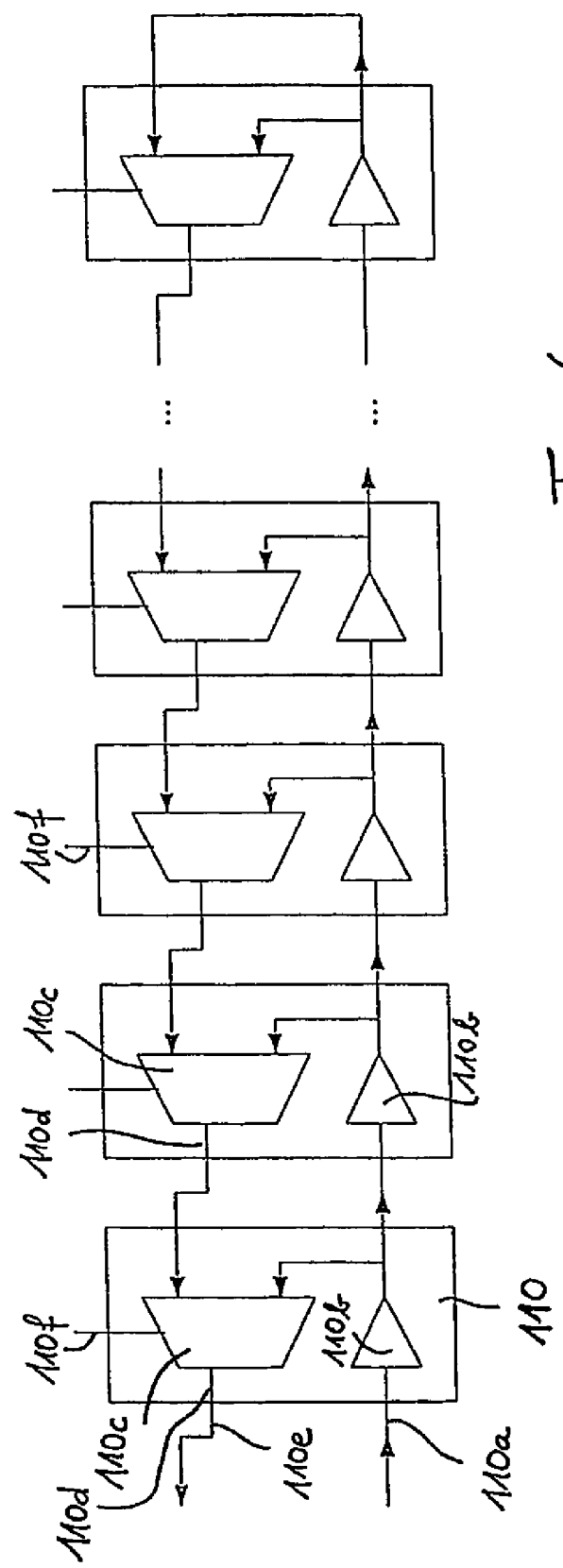
FIG. 6 shows an exemplary embodiment of a coarse delay stage with individual coarse delay elements.

FIG. 6 shows a preferred exemplary embodiment of a coarse delay stage 11 with individual coarse delay elements 110. It can be seen that each coarse delay element 110 comprises a delay element 110b and a selector 110c. The input of the selector 110c in the respective coarse delay element 110 is connected to the output of the same coarse delay element 110. A further input on the selector 110c is connected to the output of the selector in the delay element 110 connected immediately downstream.

Looking at the first delay element 110 (in FIG. 6 the one arranged at the far left), for example, the signal applied to the input 110a thus first passes through the delay element 110b and is then already applied to an input of the selector 110c in the same delay element 110. If the selector 110c in the first delay element 110 were to be actuated such that the input of the selector 110c to which the signal delayed by the delay element 110b is applied switches through to the output 110d—which in this case corresponds to the output 110e of the coarse delay stage 11 at the same time, then the output signal from the coarse delay stage 11 would be delayed all in all only by the delay effected by the delay element 110a and the selector 110c. The delay elements 110 connected downstream would accordingly not be activated.

The downstream delay elements 110 are designed in the same way as the first delay element 110, with just the last delay element 110 (arranged at the far right of FIG. 6) having the same signal applied to the two inputs of the selector 110c, said signal being applied to the inputs of the selector 110c in this last delay element 110 following a delay which corresponds to the number of delay elements 110.

The signal which is respectively connected through the output 110d of a selector is stipulated using a selection connection 110f on the respective selector 110c. The inputs of each selector 110c thus just have two signals applied to them, the signal routing being correspondingly simple and being very easy to implement in silicon.

Figure 7:
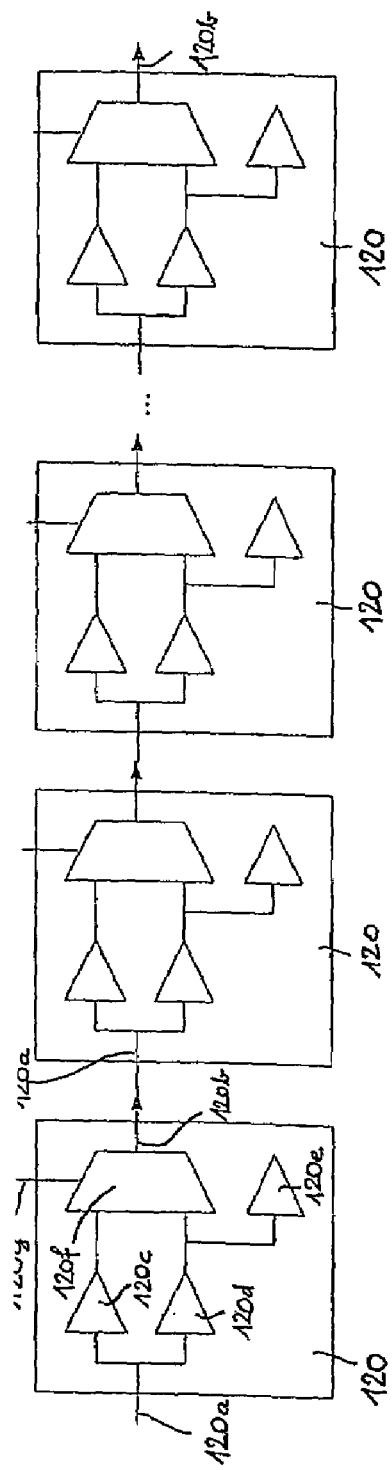
FIG. 7 shows a first exemplary embodiment of a fine delay stage with individual fine delay elements.

FIG. 7 shows a first exemplary embodiment of a fine delay stage 12. This exemplary embodiment of the fine delay stage 12 comprises a plurality of fine delay elements 120 which each have an input 120a and an output 120b. The output 120b of a preceding fine delay element 120 (e.g. the fine delay element 120 on the far left) is respectively connected to the input 120a of the subsequent fine delay element 120 (the second fine delay element 120 from the left). The output 120b of the last fine delay element 120 is simultaneously the output of the fine delay stage 12.

Each fine delay element 120 comprises two paths, a first path with a "buffer" 120c, whose output is connected to an input on a selector 120f, and a second path, which contains a further buffer 120d whose output is firstly connected to a further input on the selector 120f and which secondly has a further buffer 120e appended to it. The input of the time delay element branches into the two paths (in principle, it would also be possible to have a plurality of such paths, but the exemplary embodiment shown has exactly two).

When passing through the second path (containing the buffers 120d and 120e), the signal requires more time before it reaches the outlet of the selector 120f, because the second buffer 120e can be considered to be a capacitive load which first needs to be charged before the signal is then applied to the input of the selector and can be switched through to its output 120b. The passage through the second path thus corresponds to a time delay, because the signal cannot be applied to the input of the selector and hence also to the latter's output until at a later time. The selector comprises a selection connection 120g which can be used to select whether the signal in the first path or the signal in the second path is switched through to the output 120b. It is thus possible to set separately on each individual fine delay element 120 whether the signal which has passed through the first path or the signal which has passed through the second path is set. This is equivalent to nothing other than setting the fine delay which is set in the calibration already outlined in detail further above.

Figure 8:
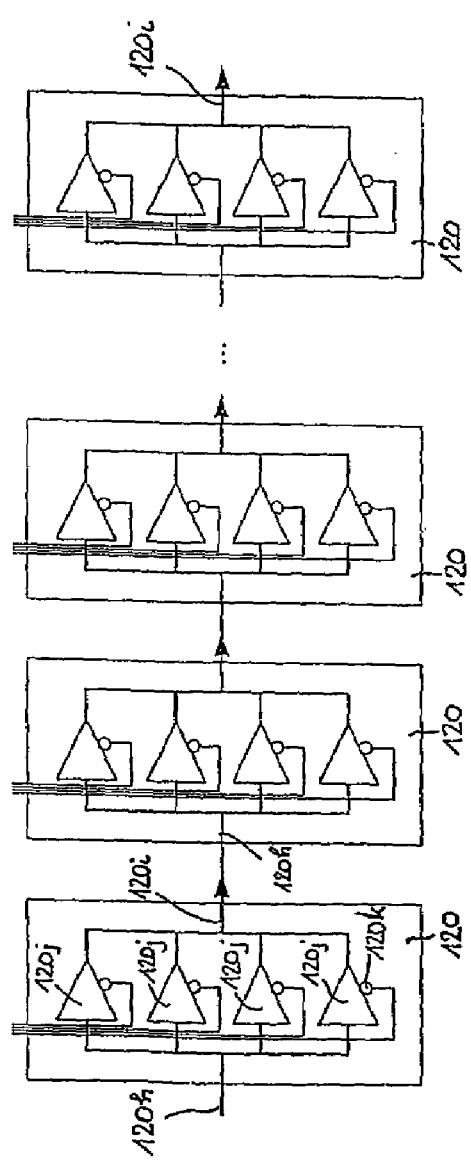
FIG. 8 shows a second exemplary embodiment of a fine delay stage with individual fine delay elements.

FIG. 8 shows a second exemplary embodiment of the fine delay stage 12 with a plurality of fine delay elements 120. In this exemplary embodiment of the fine delay stage 12, each fine delay element 120 comprises an input 120h and an output of 120i. The output 120i of a preceding fine delay element 120 (e.g. the fine delay element 120 on the far left) is respectively connected to the input 120h of the subsequent fine delay element 120 (the second fine delay element 120 from the left). The output 120i of the last fine delay element 120 is simultaneously the output of the fine delay stage 12.

Each fine delay element 120 comprises a plurality of paths which respectively contain a "tristate buffer" 120j. In the exemplary embodiment shown, there are a total of four parallel paths containing a respective tristate buffer 120j. In this arrangement, the input 120h of the fine delay element 120 branches into the four paths which contain the tristate buffers 120j.

In this case, the selector is designed such that each tristate buffer 120j can be activated or deactivated using a dedicated selection connection 120k. The tristate buffers have an input capacitance regardless of whether or not they have been activated. The more buffers are activated within a fine delay element 120, the less time it takes before the input capacitance in the subsequent delay element has been charged, and the faster the signal supplied to the output of the respective fine delay element 120. In this case too, the fine delay stage is calibrated in the manner already described further above.

Figure 9:
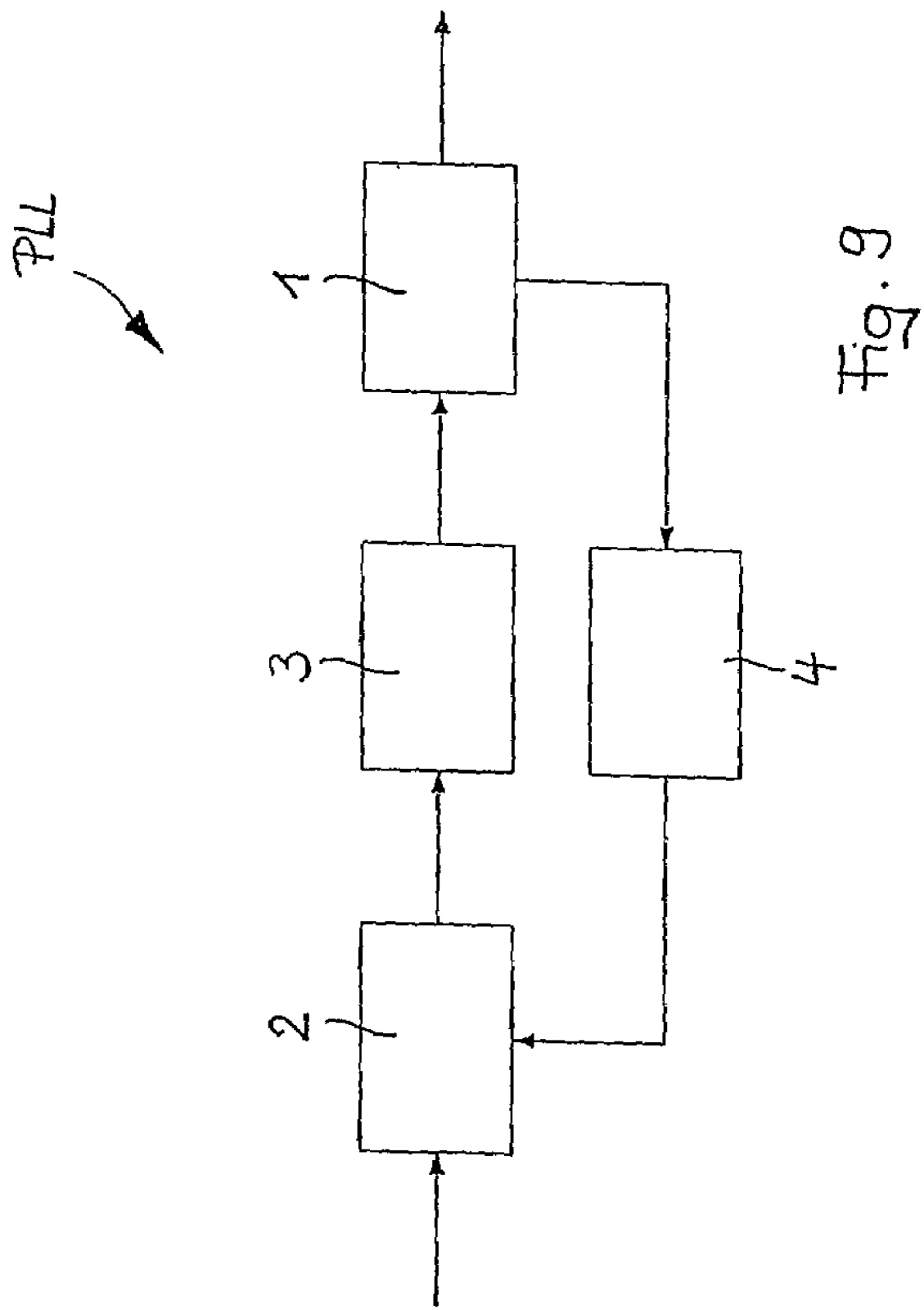
FIG. 9 shows a block diagram of a phase trimming circuit (PLL) with an inventive DCO.

FIG. 9 shows a block diagram showing fundamental elements of a phase trimming circuit PLL (Phase-Locked Loop) which comprises a digitally controlled oscillator as described above. The phase trimming circuit PLL comprises a phase comparator 2, a filter 3 for filtering out high-frequency jitter, a digitally controlled oscillator 1 designed as described above, and a frequency divider 4 in the feedback path.

The input (clock) signal affected by jitter (which incidentally is not to be confused with the input clock signal generated by the stable local oscillator in the DCO) needs to be stimulated with the correct frequency and phase by a low-jitter output clock signal. This is done using the digitally controlled oscillator which has been described above, with the phase comparator 2 checking for the correct phase.

Specific embodiments of a digitally controlled oscillator according to the present invention have been described for the purpose of illustrating the manner in which the invention may be made and used. It should be understood that implementation of other variations and modifications of the invention and its various aspects will be apparent to those skilled in the art, and that the invention is not limited by the specific embodiments described. It is therefore contemplated to cover by the present invention any and all modifications, variations, or equivalents that fall within the true spirit and scope of the basic underlying principles disclosed and claimed herein.

The invention claimed is:

1. A digitally controlled oscillator for generating a correct-phase output signal at a desired frequency, having an input for supplying a digital input word, an adder for summing the digital input words, a stable local oscillator for supplying a clock signal at a constant frequency, and a delay circuit which comprises a coarse delay stage having a plurality of series-connected coarse delay elements and a fine delay stage having a plurality of series-connected fine delay elements, such that the total delay of the coarse delay stage and the fine delay stage is proportioned such that the maximum total delay and the minimum total delay of the delay circuit differ by no more than one period of the clock signal, and where the plurality of fine delay elements corresponds to the delay by one coarse delay element, wherein each coarse delay element includes a corresponding dedicated actuatable selector and each fine delay element includes a corresponding dedicated actuatable selector.

2. The digitally controlled oscillator as claimed in claim 1, in which the coarse delay element comprises a delay element and the selector, with one input on the selector in the respective coarse delay element being connected to the output of the delay element of the same coarse delay element and a further input on the selector being connected to the output of the selector in the coarse delay element connected immediately downstream.

3. The digitally controlled oscillator as claimed in claim 1, wherein the fine delay element has a common input and at least two drivers connected to the common input, with a capacitive load being provided at the output of one of the two drivers, which oscillator also has one input on the selector connected to the output of the driver without the capacitive load and a further input on the selector connected to the output of the driver with a capacitive load, and which oscillator has the output of the selector in the respective fine delay element connected to the common input of the fine delay element connected immediately downstream.

4. The digitally controlled oscillator as claimed in claim 1, wherein the fine delay element comprises a plurality of drivers whose inputs are connected to one another to form a common input and whose outputs are connected to one another to form a common output, in which also the selector is designed such that the individual drivers may be activated or deactivated, and in which the common output is connected to the common input of the fine delay element connected immediately downstream.

5. A digital phase trimming circuit (PLL), having an input clock signal, having a phase comparator, a filter, a digitally controlled oscillator, and a feedback path which feeds back an output signal generated by the digitally controlled oscillator to the phase comparator, including frequency multiplication and/or frequency division, wherein the digitally controlled oscillator is designed in accordance with claim 1.

* * * * *